US012293975B2

(12) United States Patent
Otsubo et al.

(10) Patent No.: US 12,293,975 B2
(45) Date of Patent: May 6, 2025

(54) HIGH-FREQUENCY MODULE HAVING A COMPARTMENT SHIELD STRUCTURE

(71) Applicant: Murata Manufacturing Co., Ltd., Kyoto-fu (JP)

(72) Inventors: Yoshihito Otsubo, Nagaokakyo (JP); Takafumi Kusuyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 521 days.

(21) Appl. No.: 17/806,769

(22) Filed: Jun. 14, 2022

(65) Prior Publication Data

US 2022/0320007 A1  Oct. 6, 2022

Related U.S. Application Data

(63) Continuation of application No. PCT/JP2020/046233, filed on Dec. 11, 2020.

(30) Foreign Application Priority Data

Dec. 27, 2019 (JP) .................. 2019-238356

(51) Int. Cl.
   *H01L 23/31*  (2006.01)
   *H01L 21/48*  (2006.01)
   (Continued)

(52) U.S. Cl.
   CPC ........ *H01L 23/552* (2013.01); *H01L 21/4853* (2013.01); *H01L 21/4857* (2013.01);
   (Continued)

(58) Field of Classification Search
   CPC ................................ H01L 23/49838
   See application file for complete search history.

(56) References Cited

U.S. PATENT DOCUMENTS 6,037,846 A * 3/2000 Oberhammer ....... H05K 9/0015
                                                       333/182
2006/0258050 A1 11/2006 Fujiwara et al.
(Continued)

FOREIGN PATENT DOCUMENTS

JP   2005-317935 A  11/2005
WO   2012/023332 A1  2/2012
(Continued)

OTHER PUBLICATIONS

International Search Report for PCT/JP2020/046233 dated Mar. 2, 2021.

*Primary Examiner* — Evren Seven
(74) *Attorney, Agent, or Firm* — McDonald Hopkins LLC (57) ABSTRACT

A module includes a main substrate, a sub-module mounted on a first surface of the main substrate, a first component mounted on the first surface separately from the sub-module, and a first sealing resin formed so as to cover the first surface and the first component. The sub-module includes a second component, a second sealing resin disposed so as to cover the second component, and an inner shield film formed so as to cover at least a part of side surfaces of the second sealing resin and not to electrically connect to the main substrate. A ground connection conductor is disposed so as to electrically connect to the inner shield film, and the ground connection conductor is exposed to the outside.

19 Claims, 12 Drawing Sheets

(51) Int. Cl.
*H01L 21/56* (2006.01)
*H01L 23/498* (2006.01)
*H01L 23/552* (2006.01)

(52) U.S. Cl.
CPC ........ *H01L 21/565* (2013.01); *H01L 23/3121* (2013.01); *H01L 23/49822* (2013.01); *H01L 23/49838* (2013.01)

(56) References Cited

U.S. PATENT DOCUMENTS

| | | | |
|---|---|---|---|
| 2006/0267159 A1* | 11/2006 | Yamamoto | H01L 23/3121 257/E23.125 |
| 2013/0155639 A1* | 6/2013 | Ogawa | H01L 25/16 29/841 |
| 2013/0301227 A1* | 11/2013 | Kawano | H01L 25/16 361/748 |
| 2014/0085843 A1* | 3/2014 | Otsubo | H05K 1/181 29/832 |
| 2018/0096950 A1 | 4/2018 | Chen et al. | |
| 2019/0013300 A1* | 1/2019 | Baek | H01L 23/552 |
| 2019/0273312 A1 | 9/2019 | Otsubo | |
| 2019/0287953 A1* | 9/2019 | Moon | H01L 23/552 |
| 2019/0289758 A1* | 9/2019 | Furuya | H05K 5/065 |
| 2020/0007174 A1 | 1/2020 | Watanabe | |
| 2020/0135654 A1* | 4/2020 | Lee | H01L 23/3135 |
| 2020/0203288 A1 | 6/2020 | Otsubo et al. | |
| 2020/0281102 A1 | 9/2020 | Otsubo et al. | |
| 2020/0343151 A1 | 10/2020 | Nomura et al. | |
| 2021/0043585 A1* | 2/2021 | Nomura | H01L 23/3128 |
| 2022/0199504 A1* | 6/2022 | Otsubo | H01L 23/28 |

FOREIGN PATENT DOCUMENTS

| | | |
|---|---|---|
| WO | 2018/101384 A1 | 6/2018 |
| WO | 2018/168653 A1 | 9/2018 |
| WO | 2019/045088 A1 | 3/2019 |
| WO | 2019/098316 A1 | 5/2019 |
| WO | 2019/138895 A1 | 7/2019 |

* cited by examiner

HIGH-FREQUENCY MODULE HAVING A COMPARTMENT SHIELD STRUCTURE

CROSS REFERENCE TO RELATED APPLICATION

This is a continuation of International Application No. PCT/JP2020/046233 filed on Dec. 11, 2020 which claims priority from Japanese Patent Application No. 2019-238356 filed on Dec. 27, 2019. The contents of these applications are incorporated herein by reference in their entireties.

BACKGROUND OF THE DISCLOSURE

Field of the Disclosure

The present disclosure relates to a module.

Description of the Related Art

A device called a "high-frequency module" is disclosed in WO 2018/101384 A1 (PTL 1). As disclosed in PTL 1, a sealing resin layer is disposed on a surface of a circuit board, and a shield wall is formed so as to pass through the sealing resin layer. The shield wall is connected to a surface layer electrode disposed on the surface of the circuit board. According to the disclosure disclosed in PTL 1, in order to form the shield wall, a method by which a groove is formed in the sealing resin layer by laser beam machining, and the groove is filled with a conductive paste is used.

PTL 1: WO 2018/101384 A1

BRIEF SUMMARY OF THE DISCLOSURE

For a module having a compartment shield structure, how to establish a ground for a shield member disposed inside a sealing resin is a technical challenge. The shield wall disclosed in PTL 1 is an example of the shield member. As disclosed in PTL 1, when the groove is formed in the sealing resin layer by laser beam machining, it is necessary to dispose the surface layer electrode on the surface of the circuit board in advance in order to prevent the circuit board from being damaged by laser beams. This causes the surface layer electrode to receive emitted laser beams, thereby preventing the circuit board from being damaged.

Disposing the surface layer electrode, however, requires the occupation of some area of the surface of the substrate. This reduces the degree of freedom in layout of other wiring, components, or the like on the surface of the substrate. Furthermore, in order to establish a ground for the shield wall through the surface layer electrode, it is necessary to prepare wiring for the ground connection on or in the substrate, which reduces the degree of freedom in design of the substrate.

It is therefore an object of the present disclosure to provide a module that allows a surface and inside of a substrate to be designed more freely even with a compartment shield structure provided.

In order to achieve the above-described object, a module according to the present disclosure includes a main substrate having a first surface and a second surface on a side opposite from the first surface, a sub-module mounted on the first surface, a first component mounted on the first surface separately from the sub-module, and a first sealing resin formed so as to cover the first surface and the first component. The sub-module includes a second component, a second sealing resin disposed so as to cover the second component, and an inner shield film formed so as to cover at least a part of side surfaces of the second sealing resin and to not electrically connect to the main substrate. A ground connection conductor is disposed so as to electrically connect to the inner shield film. The ground connection conductor is exposed outside the first sealing resin.

According to the present disclosure, it is possible to manufacture the sub-module at a separate place in advance and mount the sub-module to construct the module. This eliminates the need of providing a section that receives laser beams for grooving. Furthermore, since the ground connection conductor is disposed so as to electrically connect to the inner shield film and is exposed outside the first sealing resin, when the module is mounted on a motherboard or the like, the exposed portion of the ground connection conductor can be used to establish electrical connection for grounding the inner shield film. This allows the electrical connection for grounding the inner shield film to be established without passing through the main substrate, so that, even with the compartment shield structure provided, the surface and inside of the substrate can be designed more freely.

DETAILED DESCRIPTION OF THE DISCLOSURE

The dimensional ratios illustrated in the drawings do not necessarily represent the actual dimensional ratios, and the dimensional ratios may be exaggerated for convenience of description. In the following description, when referring to a superordinate or subordinate concept, it does not necessarily mean an absolute superordinate or subordinate, but may mean a relative superordinate or subordinate in the illustrated modes.

First Embodiment

With reference to FIGS. 1 to 4, a module according to a first embodiment of the present disclosure will be described.

Figure 1:
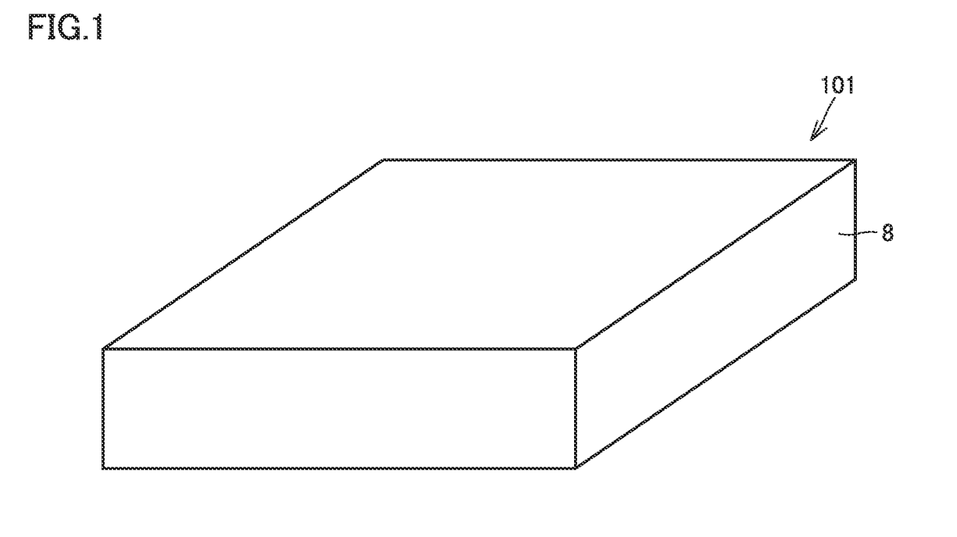
FIG. 1 is a first perspective view of a module according to a first embodiment of the present disclosure.
Figure 2:
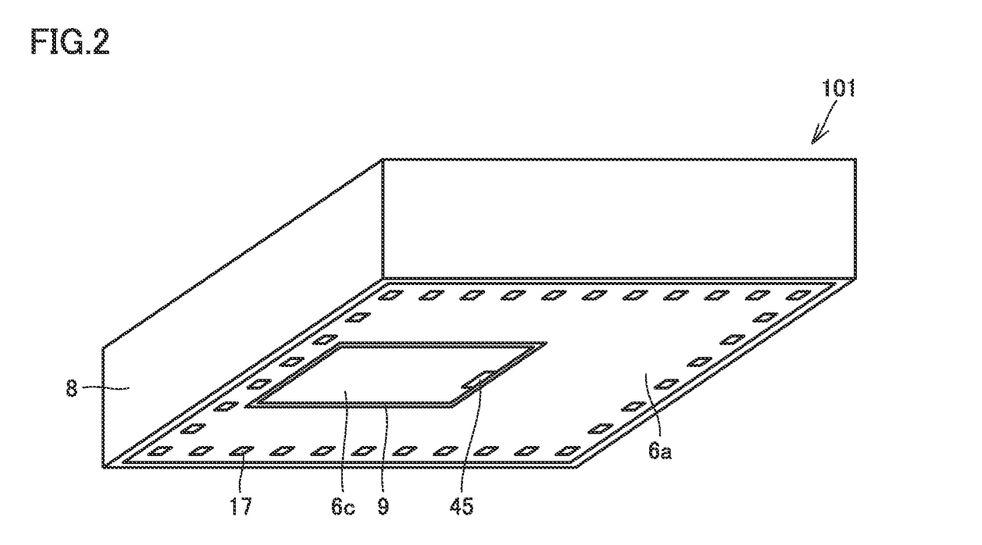
FIG. 2 is a second perspective view of the module according to the first embodiment of the present disclosure.
Figure 3:
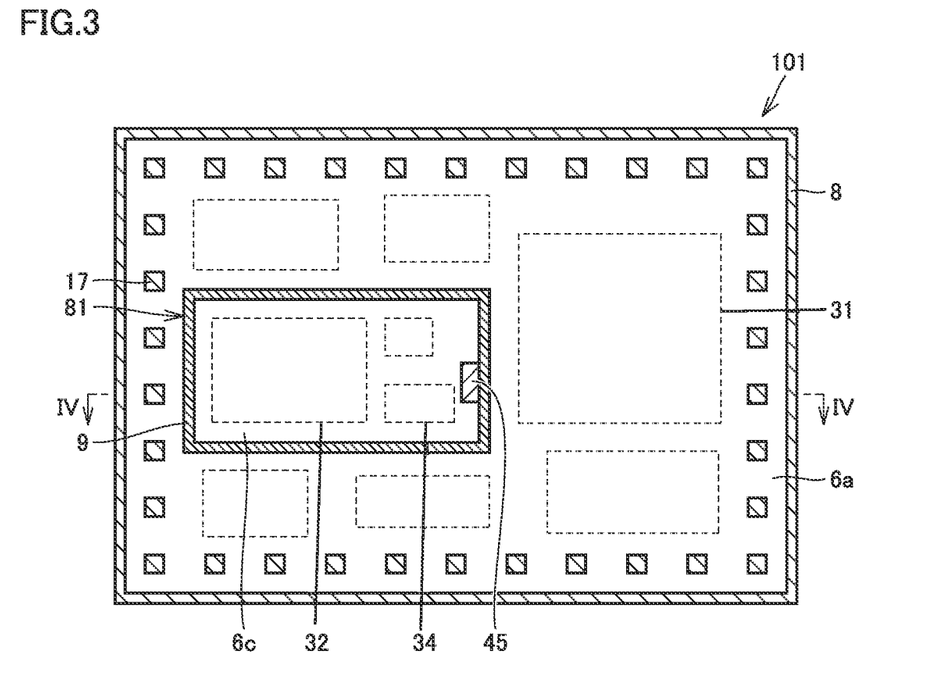
FIG. 3 is a bottom view of the module according to the first embodiment of the present disclosure.
Figure 4:
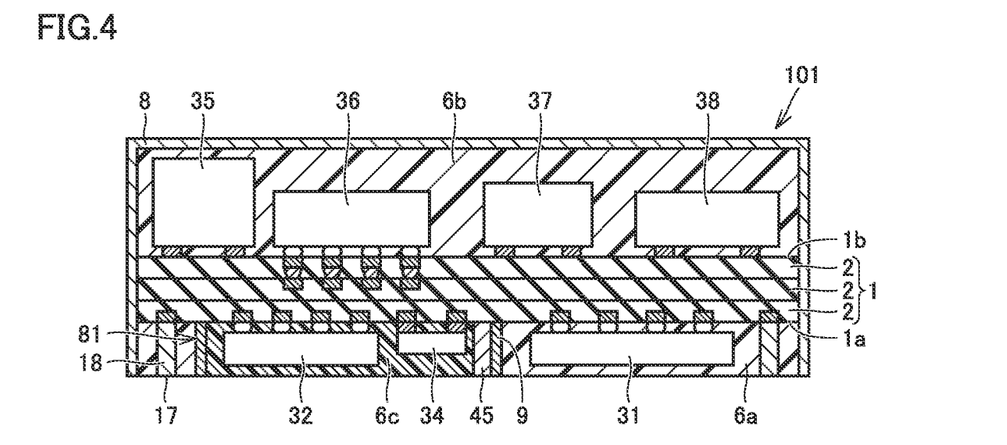
FIG. 4 is a cross-sectional view taken along a line IV-IV, as viewed in the direction of arrows in FIG. 3.

FIG. 1 illustrates the appearance of a module 101 according to the present embodiment. An upper surface and side surfaces of module 101 are covered with an outer shield film 8. FIG. 2 illustrates module 101 as viewed obliquely from below in FIG. 1. FIG. 3 is a bottom view of module 101. A lower surface of module 101 is not covered with outer shield film 8. At least one external terminal 17 is provided on the lower surface of module 101. In the example illustrated here, the plurality of external terminals 17 are annularly arranged along an outer periphery of the lower surface of module 101. The number, size, and arrangement of external terminals 17 illustrated in FIGS. 2 and 3 are merely examples. FIG. 4 is a cross-sectional view taken along a line Iv-Iv, as viewed in the direction of arrows in FIG. 3. In FIG. 3, components contained in module 101 and encapsulated in resin are indicated by dashed lines.

In the example illustrated here, a first sealing resin 6a and a second sealing resin 6c are exposed from the lower surface of module 101, but this configuration is merely an example. The lower surface of module 101 other than an area where external terminals 17 and a ground connection conductor 45 are provided may be covered with, for example, a resist film.

A first component 31 contained in module 101 may be, for example, an integrated circuit (IC). More specifically, first component 31 may be, for example, a low noise amplifier (LNA). A main substrate 1 may include wiring thereon or therein. That is, main substrate 1 may be referred to as a circuit board. Main substrate 1 may be a resin substrate or a ceramic substrate. Main substrate 1 may be a multilayer substrate. That is, main substrate 1 may be a resin multilayer substrate or a ceramic multilayer substrate. In the example illustrated in FIG. 4, main substrate 1 is formed of a laminate of a plurality of insulating layers 2. Each insulating layer 2 is, for example, a resin layer.

Module 101 includes main substrate 1 having a first surface 1a and a second surface 1b on a side opposite from first surface 1a, a sub-module 81 mounted on first surface 1a, first component 31 mounted on first surface 1a separately from sub-module 81, and first sealing resin 6a formed so as to cover first surface 1a and first component 31. Sub-module 81 is formed smaller in area than main substrate 1.

Sub-module 81 includes a second component 32, second sealing resin 6c disposed so as to cover second component 32, and an inner shield film 9 formed so as to cover at least one of the side surfaces of second sealing resin 6c and not to electrically connect to main substrate 1. A surface of second sealing resin 6c remote from first surface 1a is not covered with inner shield film 9. Ground connection conductor 45 is disposed so as to electrically connect to inner shield film 9. Ground connection conductor 45 is exposed outside first sealing resin 6a. In the present embodiment, ground connection conductor 45 is provided on first surface 1a of main substrate 1. That is, ground connection conductor 45 is substantially equal in dimension in a height direction to inner shield film 9.

As illustrated in FIG. 4, on the lower surface of module 101, inner shield film 9 is exposed in a thin line shape, whereas ground connection conductor 45 is exposed in a certain integrated shape. The shape of the exposed surface of ground connection conductor 45 is, for example, rectangular. As illustrated in FIG. 4, any other component may be contained in sub-module 81 in addition to second component 32. In the example illustrated in FIG. 4, a component 34 is contained in sub-module 81.

In the example illustrated here, components 35, 36, 37, 38 are mounted on second surface 1b of main substrate 1. Second surface 1b and components 35, 36, 37, 38 are covered with a third sealing resin 6b. The arrangement, number, shape, and the like of components 35, 36, 37, 38 are merely examples, and are not limited to the examples illustrated in FIG. 4.

In the present embodiment, it is possible to manufacture sub-module 81 at a separate place in advance and mount sub-module 81 to construct module 101. This eliminates the need of providing a section that receives laser beams for grooving. Furthermore, since ground connection conductor 45 is disposed so as to electrically connect to inner shield film 9 and is exposed outside first sealing resin 6a, when module 101 is mounted on a motherboard or the like, the exposed portion of ground connection conductor 45 can be used to establish electrical connection for grounding inner shield film 9. This allows the electrical connection for grounding inner shield film 9 to be established without passing through main substrate 1, so that the surface and inside of the substrate can be designed more freely. The term "substrate" used herein refers to main substrate 1.

As described in the present embodiment, it is preferable that ground connection conductor 45 be in contact with first surface 1a and be disposed along inner shield film 9. The use of such a configuration allows ground connection conductor 45 to be formed by a conductor member mounted on first surface 1a as described later, which makes the module production simple. In the present embodiment, ground connection conductor 45 is an integrated conductor member.

As described in the present embodiment, ground connection conductor 45 has a columnar shape, and ground connection conductor 45 is preferably equal in height relative to first surface 1a to second sealing resin 6c. The use of such a configuration allows the height of ground connection conductor 45 to be adjusted by grinding the conductor member mounted on first surface 1a, which makes the module production simple. Further, when ground connection conductor 45 is disposed so as to be in contact with inner shield film 9 over the entire length in the height direction, a ground for inner shield film 9 can be established over a wide range.

As described in the present embodiment, module 101 preferably includes component 36 as a third component mounted on second surface 1b, third sealing resin 6b disposed so as to cover second surface 1b and the third component, and outer shield film 8 formed so as to cover the side surfaces of first sealing resin 6a, the side surfaces of main substrate 1, and the surface of third sealing resin 6b remote from second surface 1b and the side surfaces of third sealing resin 6b. The use of such a configuration allows more components to be mounted on main substrate 1 having a limited area. Further, outer shield film 8 is provided in addition to inner shield film 9 as described above, thereby allowing an increase in shielding performance.

Figure 5:
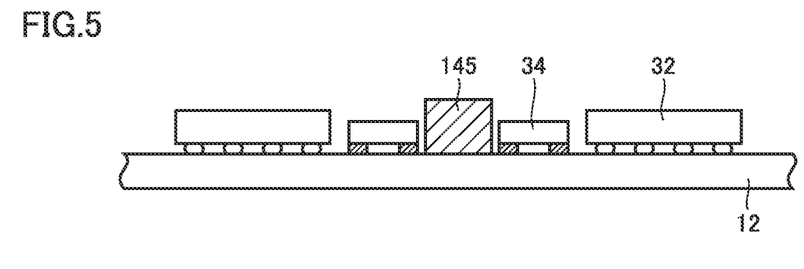
FIG. 5 is a diagram for describing a first process of a method for manufacturing the module according to the first embodiment of the present disclosure.

With reference to FIGS. 5 to 15, a method for manufacturing module 101 according to the present embodiment will be described. As illustrated in FIG. 5, components 32, 34 and a member 145 are attached to a surface of a carrier tape 12. Member 145 is a conductor member that becomes ground connection conductor 45 later. Member 145 may be, for example, a metal block. Member 145 may be, for example, a metal wire.

Figure 6:
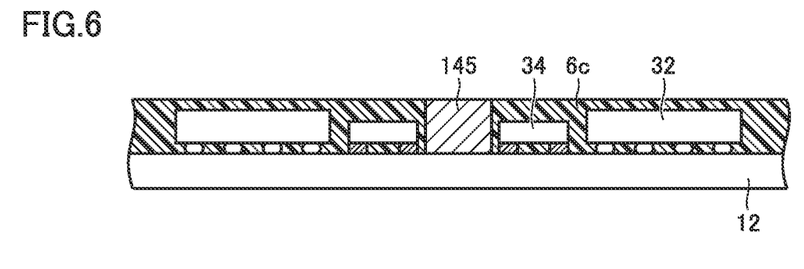
FIG. 6 is a diagram for describing a second process of the method for manufacturing the module according to the first embodiment of the present disclosure.
Figure 7:
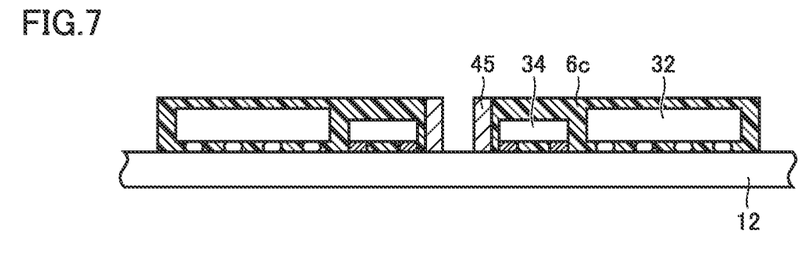
FIG. 7 is a diagram for describing a third process of the method for manufacturing the module according to the first embodiment of the present disclosure.

As illustrated in FIG. 6, second sealing resin 6c is disposed. Second sealing resin 6c may be formed by molding. A surface of member 145 remote from carrier tape 12 is exposed from second sealing resin 6c. Alternatively, the surface of member 145 remote from carrier tape 12 may be once covered with second sealing resin 6c, and in this case, the surface of member 145 remote from carrier tape 12 may be ground to be exposed.

Next, second sealing resin 6c is cut into pieces, each equal in size to the individual sub-module, using a dicer or the like. At this time, member 145 is also cut. This results in a state illustrated in FIG. 7. In the example illustrated here, two ground connection conductors 45 are formed from one member 145. The size of member 145 is determined with consideration given to a width of a portion lost as chips when member 145 is cut by the dicer. Therefore, the width of member 145 illustrated in FIG. 5 is greater than twice the width of ground connection conductor 45 illustrated in FIG. 7.

Figure 8:
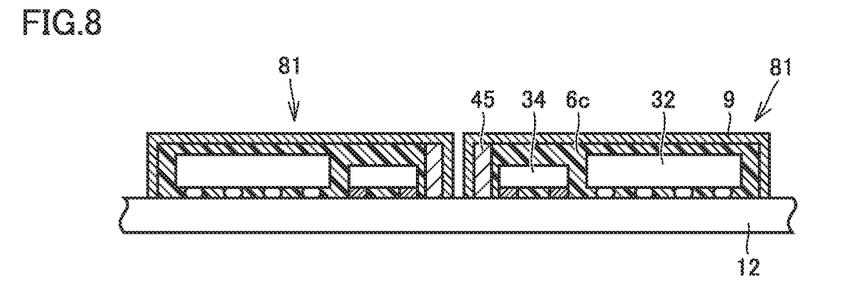
FIG. 8 is a diagram for describing a fourth process of the method for manufacturing the module according to the first embodiment of the present disclosure.
Figure 9:
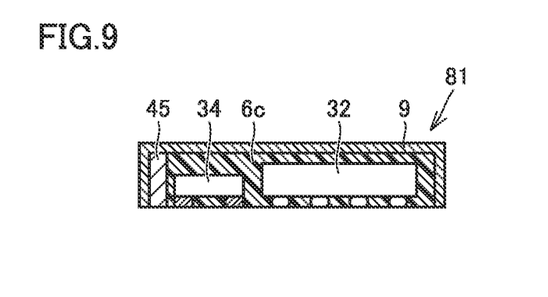
FIG. 9 is a diagram for describing a fifth process of the method for manufacturing the module according to the first embodiment of the present disclosure.
Figure 10:
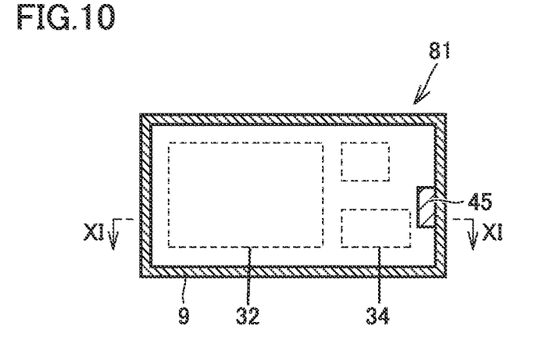
FIG. 10 is a bottom view of a sub-module illustrated in FIG. 9.
Figure 11:
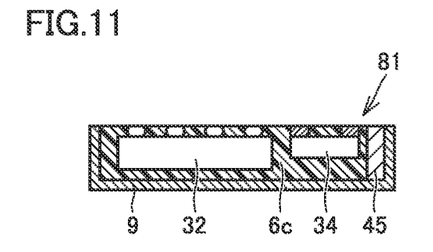
FIG. 11 is a cross-sectional view taken along a line XI-XI, as viewed in the direction of arrows in FIG. 10.

As illustrated in FIG. 8, inner shield film 9 is formed by a method such as sputtering. Second sealing resin 6c and ground connection conductor 45 are covered with inner shield film 9. FIG. 8 illustrates a state where sub-module 81 is already formed and attached to carrier tape 12. Subsequently, sub-module 81 as a single unit can be obtained as illustrated in FIG. 9 by removing sub-module 81 from carrier tape 12. FIG. 10 illustrates sub-module 81 as viewed from below. In FIG. 10, components such as terminals are not illustrated. FIG. 11 is a cross-sectional view taken along a line XI-XI, as viewed in the direction of arrows in FIG. 10.

Figure 12:
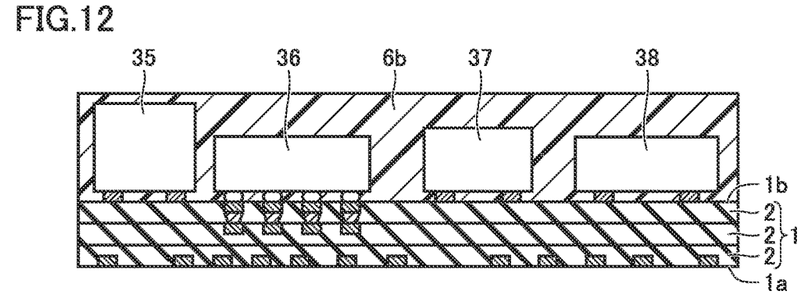
FIG. 12 is a diagram for describing a sixth process of the method for manufacturing the module according to the first embodiment of the present disclosure.

As illustrated in FIG. 12, main substrate 1 on which some components are mounted and encapsulated in resin is separately prepared. In FIG. 12, the semi-finished product already has a size equal to the size of the individual product, but in practice, the semi-finished product may be an assembly substrate before being cut. Several components are mounted on second surface 1b of main substrate 1. Second surface 1b and such components are encapsulated in third sealing resin 6b.

Figure 13:
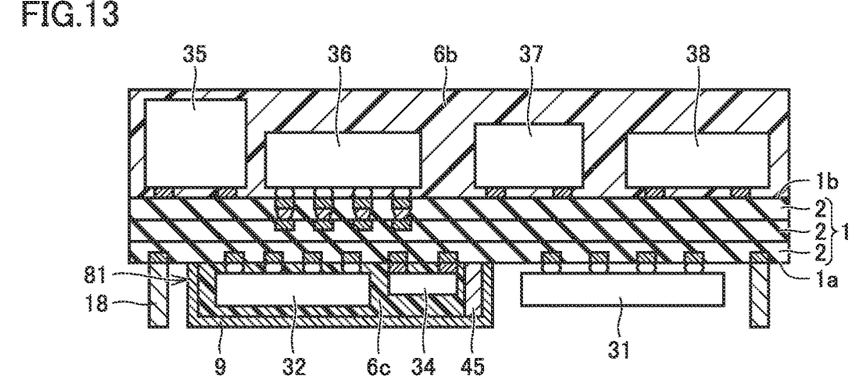
FIG. 13 is a diagram for describing a seventh process of the method for manufacturing the module according to the first embodiment of the present disclosure.
Figure 14:
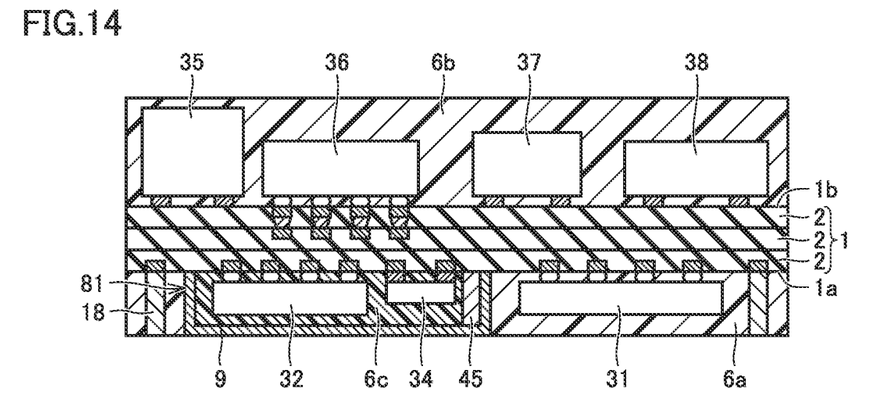
FIG. 14 is a diagram for describing an eighth process of the method for manufacturing the module according to the first embodiment of the present disclosure.
Figure 15:
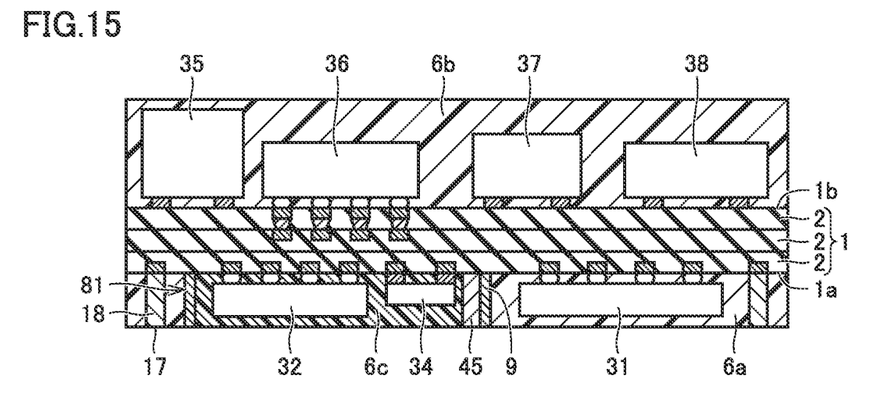
FIG. 15 is a diagram for describing a ninth process of the method for manufacturing the module according to the first embodiment of the present disclosure.

As illustrated in FIG. 13, sub-module 81 is mounted on first surface 1a of main substrate 1. In addition, a columnar conductor 18 is mounted on first surface 1a. As illustrated in FIG. 14, first sealing resin 6a is disposed so as to cover first surface 1a and some components mounted on first surface 1a. First sealing resin 6a may be formed by molding. Further, as illustrated in FIG. 15, the lower surface is ground. This grinding processing causes a portion of inner shield film 9 covering the surface of sub-module 81 remote from main substrate 1 to be removed. The grinding processing causes an end surface of ground connection conductor 45 remote from main substrate 1 to be exposed. The grinding processing causes the tip of columnar conductor 18 to be partially removed. An end surface newly generated of columnar conductor 18 remote from main substrate 1 by the grinding processing becomes external terminal 17.

Outer shield film 8 is formed by a method such as sputtering. As a result, module 101 illustrated in FIG. 4 is obtained.

Second Embodiment

Figure 16:
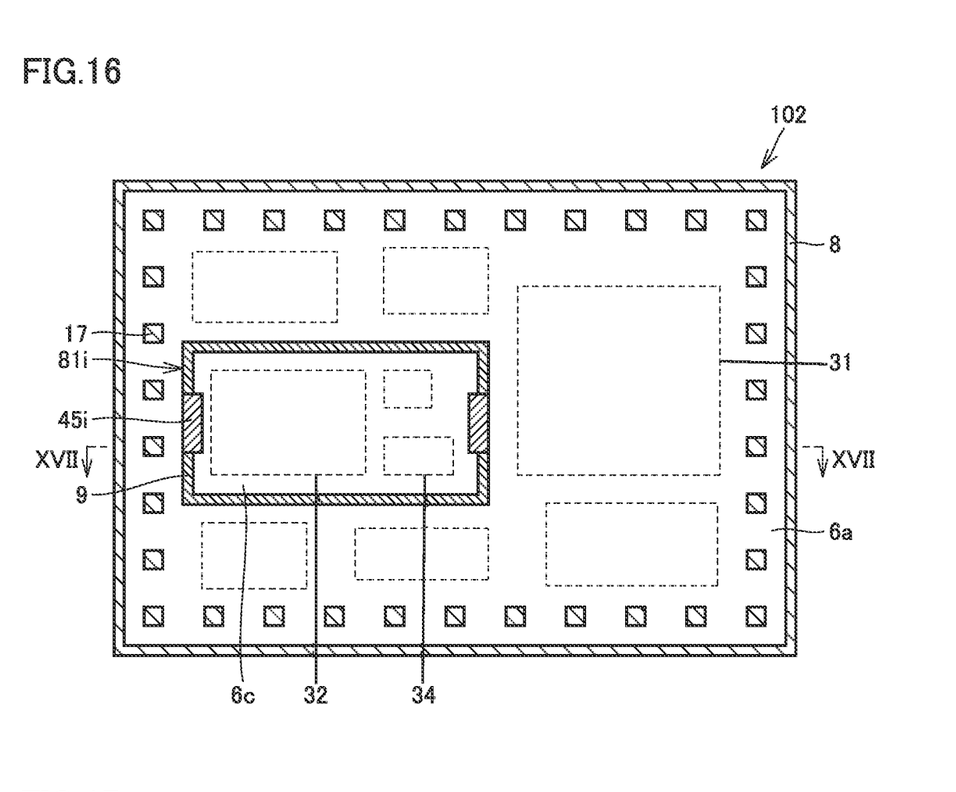
FIG. 16 is a bottom view of a module according to a second embodiment of the present disclosure.
Figure 17:
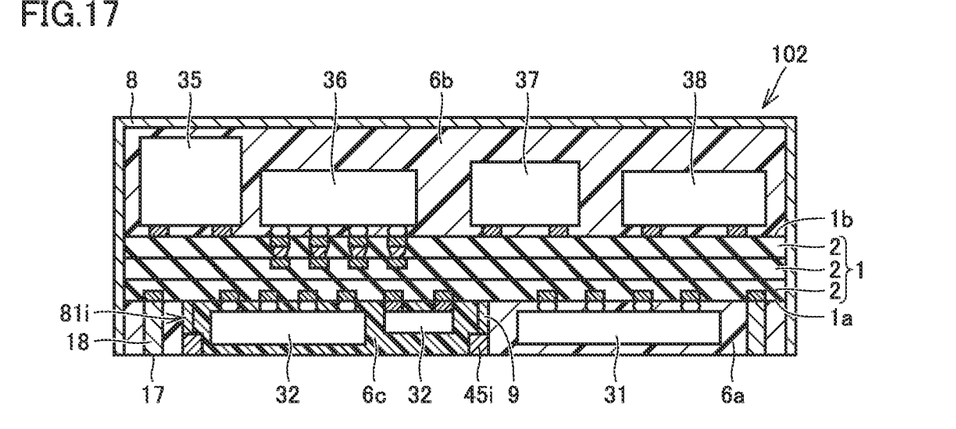
FIG. 17 is a cross-sectional view taken along a line XVII-XVII, as viewed in the direction of arrows in FIG. 16.

With reference to FIGS. 16 to 17, a module according to a second embodiment of the present disclosure will be described. FIG. 16 is a bottom view of a module 102 according to the present embodiment. FIG. 17 is a cross-sectional view taken along a line XVII-XVII, as viewed in the direction of arrows in FIG. 16. In FIG. 16, components contained in module 102 and encapsulated in resin are indicated by dashed lines.

Module 102 includes main substrate 1 having first surface 1a and second surface 1b on a side opposite from first surface 1a, a sub-module 81i formed smaller in area than main substrate 1 and mounted on first surface 1a, first component 31 mounted on first surface 1a separately from sub-module 81i, and first sealing resin 6a formed so as to cover first surface 1a and first component 31.

Sub-module 81i includes second component 32, second sealing resin 6c disposed so as to cover second component 32, and inner shield film 9 formed so as to cover at least one of the side surfaces of second sealing resin 6c and not to electrically connect to main substrate 1. The surface of second sealing resin 6c remote from first surface 1a is not covered with inner shield film 9. A ground connection conductor 45i is disposed so as to electrically connect to inner shield film 9. Ground connection conductor 45i is exposed outside first sealing resin 6a. Ground connection conductor 45i is not in contact with first surface 1a and is disposed remote from first surface 1a relative to an end of inner shield film 9 remote from first surface 1a. That is, ground connection conductor 45i is less in dimension in the height direction than inner shield film 9.

In the present embodiment, since ground connection conductor 45i is disposed so as to electrically connect to inner shield film 9 and is exposed outside first sealing resin 6a, when module 102 is mounted on a motherboard or the like, the exposed portion of ground connection conductor 45i can be used to establish electrical connection for grounding inner shield film 9. The present embodiment can therefore produce the same effects as the effects of the first embodiment.

In the present embodiment, since ground connection conductor 45i is separated from first surface 1a, the area occupied by the compartment shield structure on first surface 1a can be reduced.

With reference to FIGS. 18 to 21, a method for manufacturing module 102 according to the present embodiment will be described.

Figure 18:
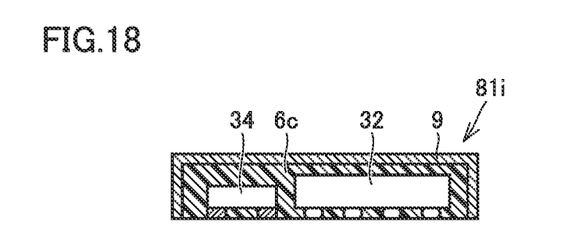
FIG. 18 is a cross-sectional view of a sub-module contained in the module according to the second embodiment of the present disclosure.

First, sub-module 81i illustrated in FIG. 18 is prepared. Sub-module 81i is different from sub-module 81 illustrated in FIG. 9 in that ground connection conductor 45 is not included. A method for manufacturing sub-module 81i is based on the method for manufacturing sub-module 81 but without the matters related to ground connection conductor 45, and a person skilled in the art will easily understand the method, so that no detailed description of the method will be given below.

Figure 19:
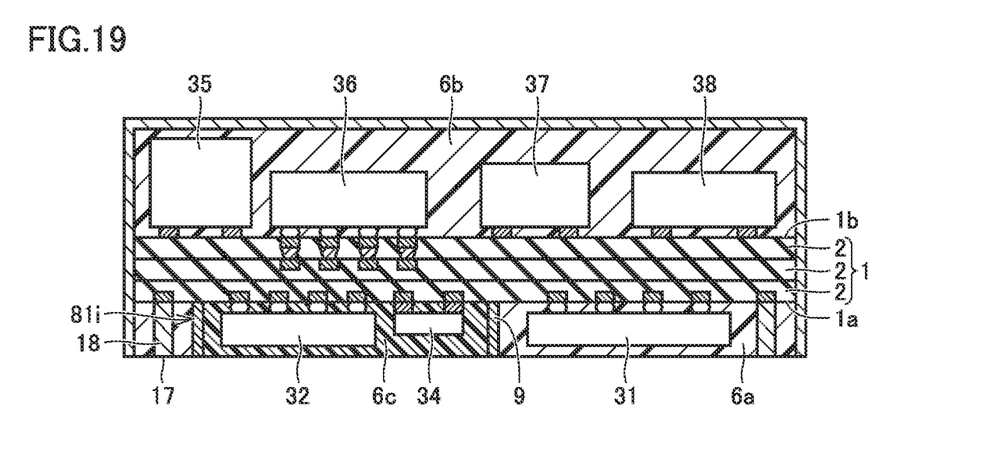
FIG. 19 is a diagram for describing a first process of a method for manufacturing the module according to the second embodiment of the present disclosure.

Mounting sub-module 81i on first surface 1a of main substrate 1, forming first sealing resin 6a, and grinding the lower surface result in a state illustrated in FIG. 19. That is, the portion of inner shield film 9 covering the top surface of sub-module 81i is removed. The surface of second sealing resin 6c remote from first surface 1a is not covered with inner shield film 9 and thus exposed. External terminal 17 is exposed as the end surface of columnar conductor 18.

Figure 20:
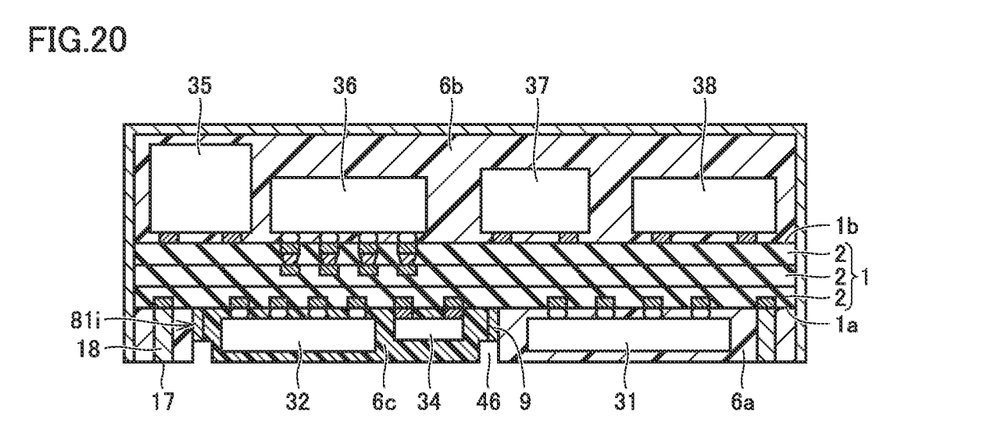
FIG. 20 is a diagram for describing a second process of the method for manufacturing the module according to the second embodiment of the present disclosure.
Figure 21:
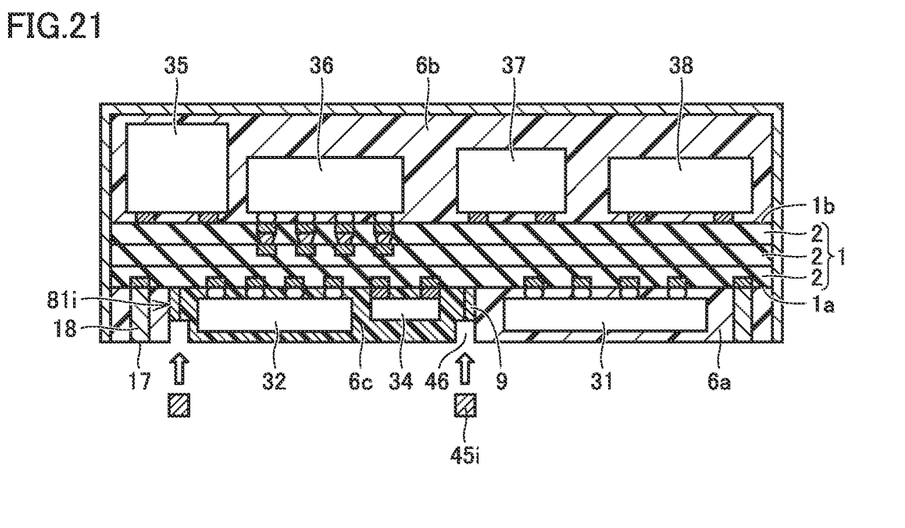
FIG. 21 is a diagram for describing a third process of the method for manufacturing the module according to the second embodiment of the present disclosure.

Next, as illustrated in FIG. 20, a depression 46 is formed. Depression 46 can be formed by, for example, laser beam machining. Depression 46 is formed so as to expose inner shield film 9. As illustrated in FIG. 21, ground connection conductor 45i is inserted into depression 46. Ground connection conductor 45i may be, for example, a metal block. When ground connection conductor 45i is inserted, solder may be interposed between an inner surface of depression 46 and ground connection conductor 45i.

As a result, module 102 illustrated in FIG. 17 can be obtained.

Third Embodiment

Figure 22:
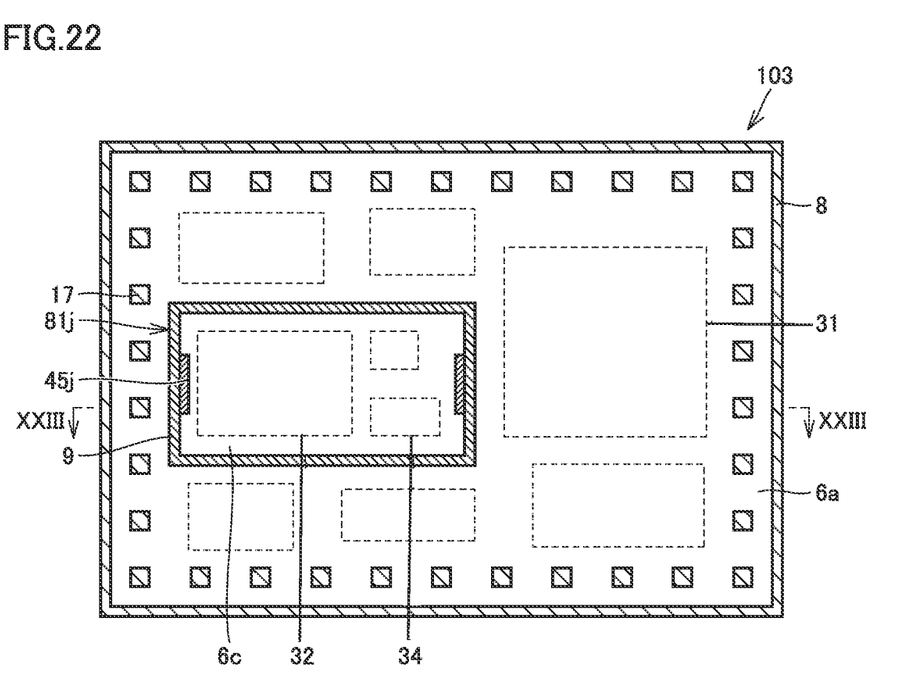
FIG. 22 is a bottom view of a module according to a third embodiment of the present disclosure.
Figure 23:
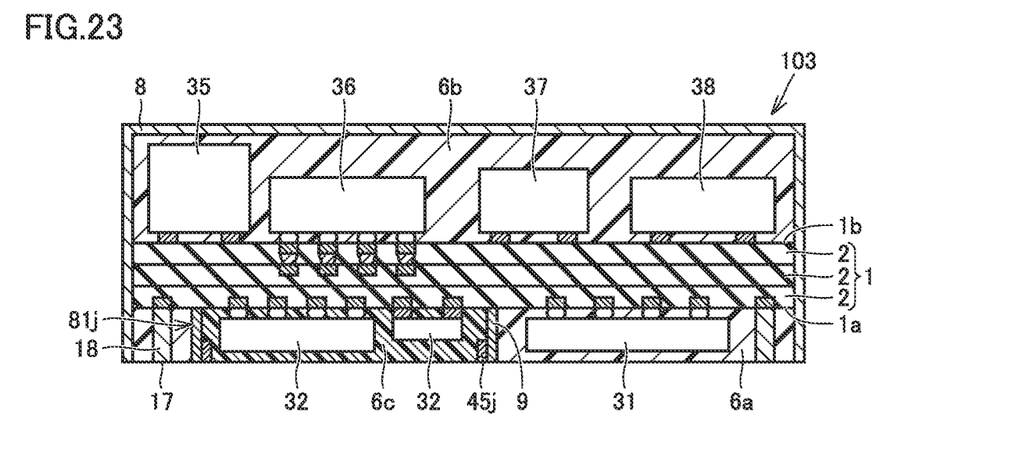
FIG. 23 is a cross-sectional view taken along a line XXIII-XXIII, as viewed in the direction of arrows in FIG. 22.

With reference to FIGS. 22 and 23, a module according to a third embodiment of the present disclosure will be described. FIG. 22 is a bottom view of a module 103 according to the present embodiment. FIG. 23 is a cross-sectional view taken along a line XXIII-XXIII, as viewed in the direction of arrows in FIG. 22. In FIG. 22, components contained in module 103 and encapsulated in resin are indicated by dashed lines.

Module 103 includes main substrate 1 having first surface 1a and second surface 1b on a side opposite from first surface 1a, a sub-module 81j formed smaller in area than main substrate 1 and mounted on first surface 1a, first component 31 mounted on first surface 1a separately from sub-module 81j, and first sealing resin 6a formed so as to cover first surface 1a and first component 31.

Sub-module 81j includes second component 32, second sealing resin 6c disposed so as to cover second component 32, and inner shield film 9 formed so as to cover at least one of the side surfaces of second sealing resin 6c and not to electrically connect to main substrate 1. The surface of second sealing resin 6c remote from first surface 1a is not covered with inner shield film 9. A ground connection conductor 45j is disposed so as to electrically connect to inner shield film 9. Ground connection conductor 45j is exposed outside first sealing resin 6a. Ground connection conductor 45j is provided inside sub-module 81j relative to inner shield film 9 so as to be in contact with internal shield film 9. Furthermore, unlike ground connection conductor 45 described in the first embodiment, ground connection conductor 45j is less in dimension in the height direction than inner shield film 9.

The present embodiment can also produce the same effects as the effects of the second embodiment.

Figure 24:
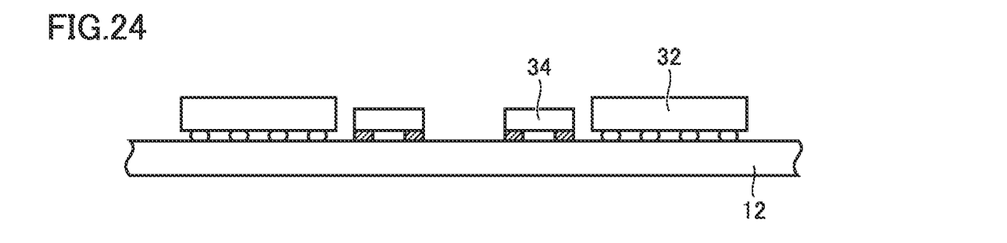
FIG. 24 is a diagram for describing a first process of a method for manufacturing the module according to the third embodiment of the present disclosure.
Figure 25:
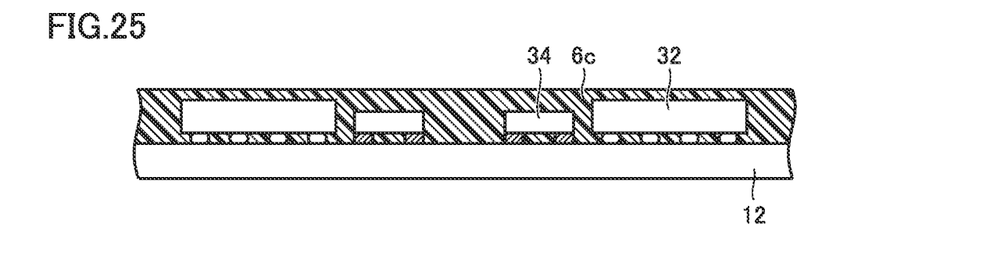
FIG. 25 is a diagram for describing a second process of the method for manufacturing the module according to the third embodiment of the present disclosure.
Figure 26:
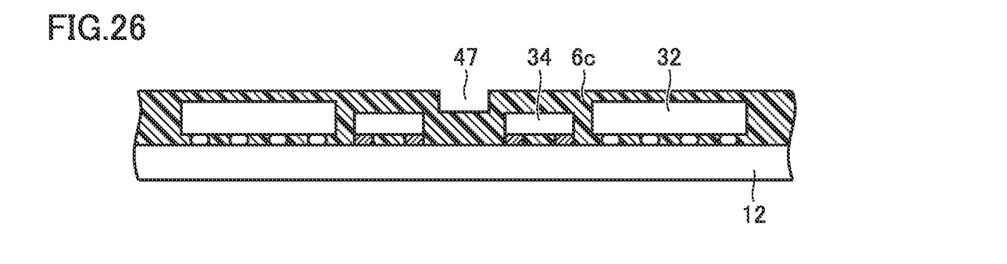
FIG. 26 is a diagram for describing a third process of the method for manufacturing the module according to the third embodiment of the present disclosure.
Figure 27:
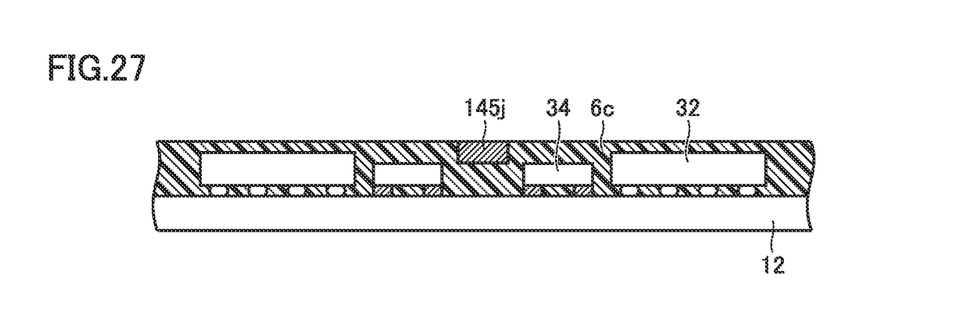
FIG. 27 is a diagram for describing a fourth process of the method for manufacturing the module according to the third embodiment of the present disclosure.

With reference to FIGS. 24 to 30, a method for manufacturing module 103 according to the present embodiment will be described. As illustrated in FIG. 24, components 32, 34 are attached to the surface of carrier tape 12. As illustrated in FIG. 25, second sealing resin 6c is disposed. Second sealing resin 6c may be formed by molding. As illustrated in FIG. 26, a depression 47 is formed in second sealing resin 6c. Depression 47 can be formed by, for example, laser beam machining. Next, as illustrated in FIG. 27, a member 145j is disposed in depression 47. Member 145j may be a block member prepared in advance. Member 145j may be formed of solder that is put into depression 47 to solidify.

Figure 28:
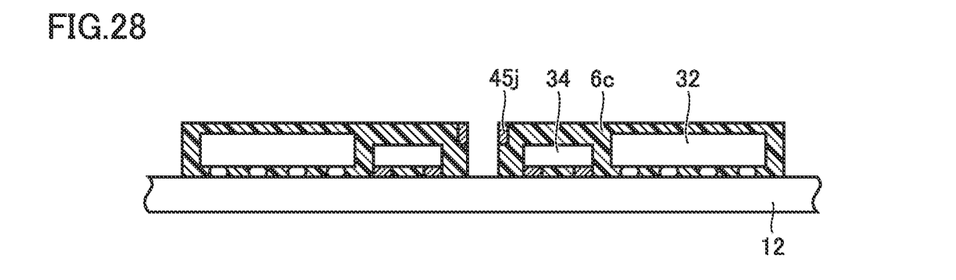
FIG. 28 is a diagram for describing a fifth process of the method for manufacturing the module according to the third embodiment of the present disclosure.
Figure 29:
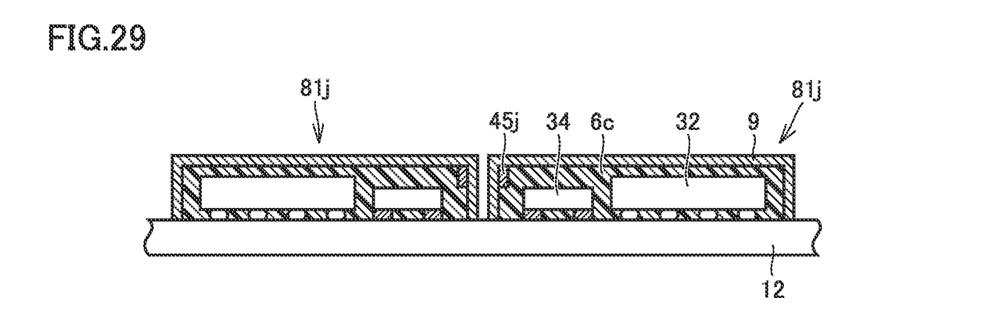
FIG. 29 is a diagram for describing a sixth process of the method for manufacturing the module according to the third embodiment of the present disclosure.
Figure 30:
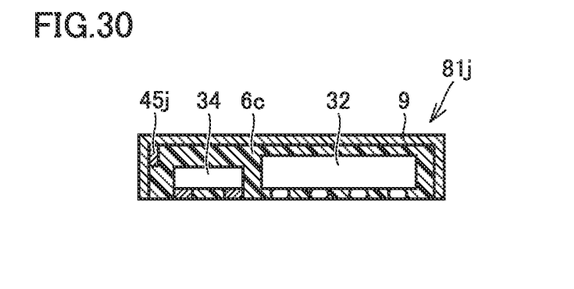
FIG. 30 is a diagram for describing a seventh process of the method for manufacturing the module according to the third embodiment of the present disclosure.

As illustrated in FIG. 28, second sealing resin 6c is cut into pieces, each equal in size to the individual sub-module. At this time, member 145j is also cut into ground connection conductors 45j. This cutting can be made by, for example, a dicer. Next, as illustrated in FIG. 29, inner shield film 9 is formed. Inner shield film 9 can be formed by, for example, sputtering. Sub-module 81j is obtained on the surface of carrier tape 12. Sub-module 81j as a single unit can be obtained as illustrated in FIG. 30 by removing sub-module 81j from carrier tape 12. Module 103 illustrated in FIGS. 22 and 23 can be obtained by mounting sub-module 81j on first surface 1a of main substrate 1 and performing grinding processing.

Fourth Embodiment

Figure 31:
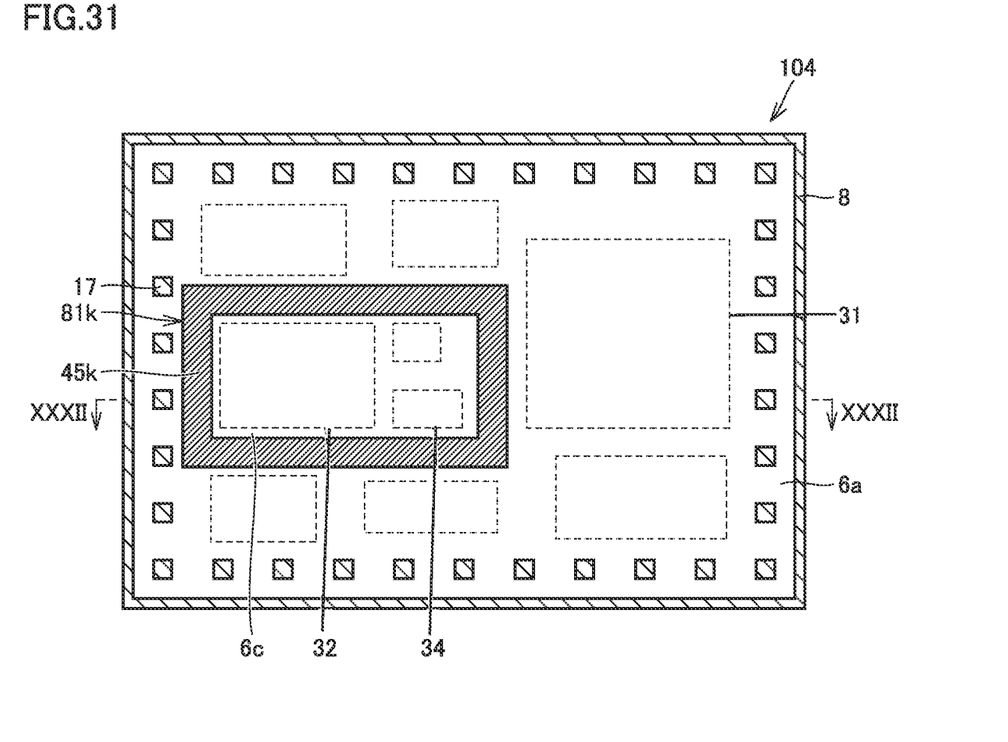
FIG. 31 is a bottom view of a module according to a fourth embodiment of the present disclosure.
Figure 32:
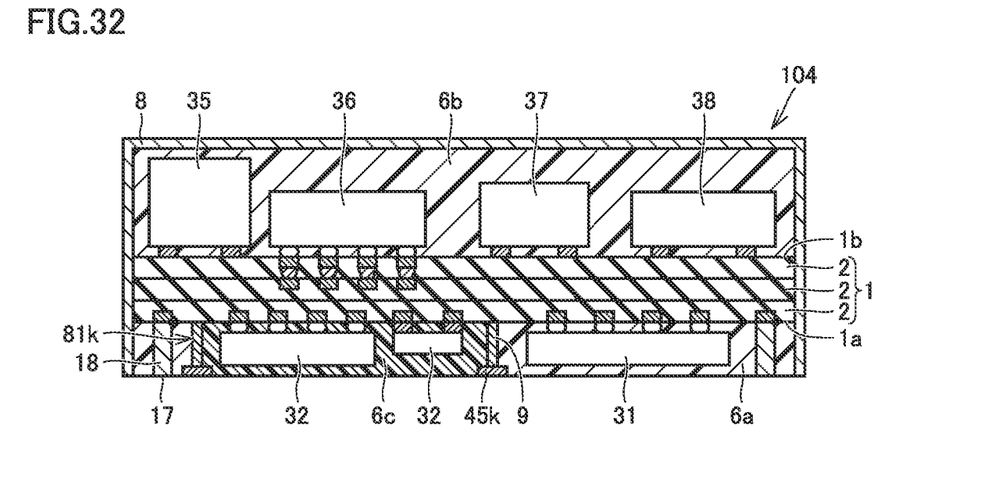
FIG. 32 is a cross-sectional view taken along a line XXXII-XXXII, as viewed in the direction of arrows in FIG. 31.

With reference to FIGS. 31 and 32, a module according to a fourth embodiment of the present disclosure will be described. FIG. 31 is a bottom view of a module 104 according to the present embodiment. FIG. 32 is a cross-sectional view taken along a line XXXII-XXXII, as viewed in the direction of arrows in FIG. 31. In FIG. 31, components contained in module 104 and encapsulated in resin are indicated by dashed lines.

Module 104 includes main substrate 1 having first surface 1a and second surface 1b on a side opposite from first surface 1a, a sub-module 81k formed smaller in area than main substrate 1 and mounted on first surface 1a, first component 31 mounted on first surface 1a separately from sub-module 81k, and first sealing resin 6a formed so as to cover first surface 1a and first component 31.

Sub-module 81k includes second component 32, second sealing resin 6c disposed so as to cover second component 32, and inner shield film 9 formed so as to cover at least one of the side surfaces of second sealing resin 6c and not to electrically connect to main substrate 1. The surface of second sealing resin 6c remote from first surface 1a is not covered with inner shield film 9. A ground connection conductor 45k is disposed so as to electrically connect to inner shield film 9. Ground connection conductor 45k is exposed outside first sealing resin 6a. Ground connection conductor 45k has a width greater than the thickness of inner shield film 9 and extends parallel to the surface of first sealing resin 6a.

The present embodiment can also produce the same effects as the effects of the second embodiment.

Figure 33:
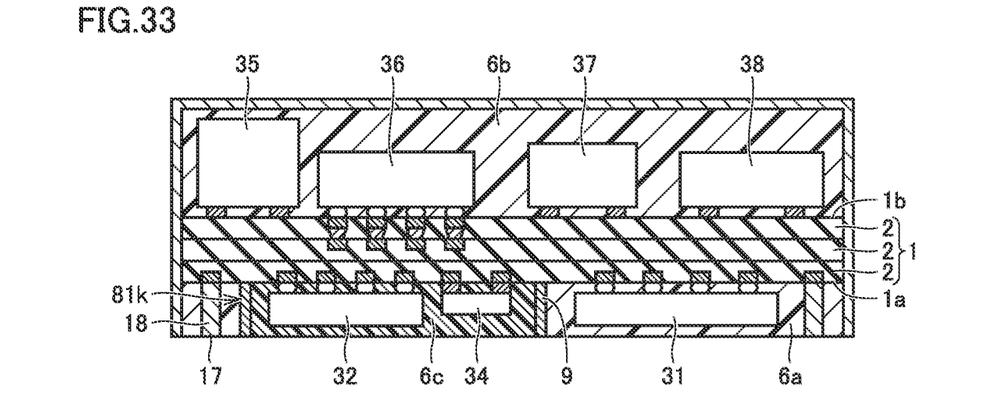
FIG. 33 is a diagram for describing a first process of a method for manufacturing the module according to the fourth embodiment of the present disclosure.
Figure 34:
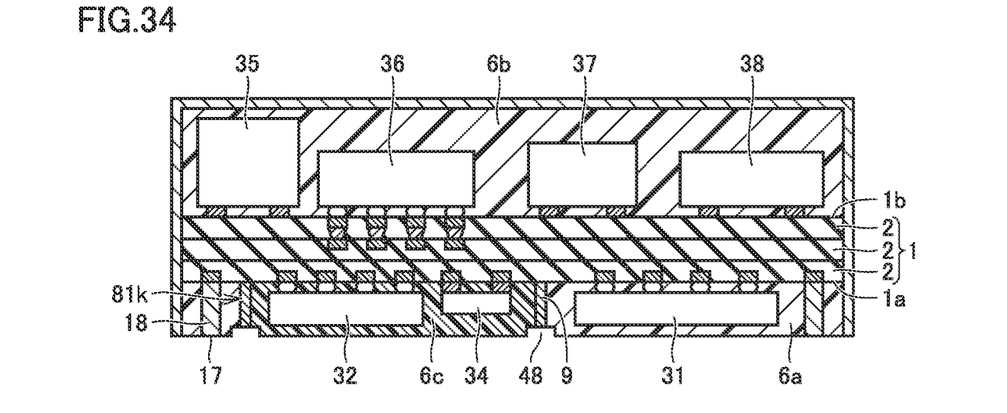
FIG. 34 is a diagram for describing a second process of the method for manufacturing the module according to the fourth embodiment of the present disclosure.

In order to obtain module 104, first, a structure illustrated in FIG. 33 is prepared. Next, as illustrated in FIG. 34, a depression 48 is formed. Depression 48 can be formed by, for example, laser beam machining. Module 104 illustrated in FIGS. 31 and 32 can be obtained by fitting a solid member into depression 48 or filling depression 48 with a paste-like material.

Modification

Figure 35:
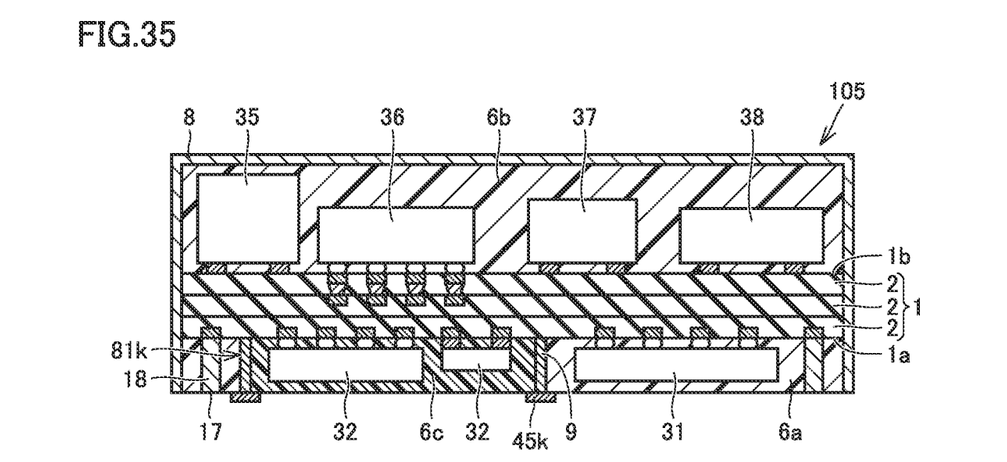
FIG. 35 is a cross-sectional view of a module according to a modification of the fourth embodiment of the present disclosure.

As a modification of module 104, a structure like a module 105 illustrated in FIG. 35 is also conceivable. In module 104, ground connection conductor 45k is fitted into the depression, but in module 105, ground connection conductor 45k is disposed so as to cover the end surface of inner shield film 9 with no depression formed. Ground connection conductor 45k may be formed by, for example, printing.

Note that, as is the case with any embodiment, the ground connection conductor is preferably any one selected from among a dot shape, a line shape, and a frame shape as viewed from a direction perpendicular to first surface 1a. For example, in module 101 illustrated in FIG. 3, ground connection conductor 45 has a short line shape. In module 102 illustrated in FIG. 16, ground connection conductor 45i has a line shape. In module 103 illustrated in FIG. 22, ground connection conductor 45j has a longer line shape. In module 104 illustrated in FIG. 31, ground connection conductor 45k has a frame shape. When the ground connection conductor has a line shape, the ground connection conductor may extend all over one side of the sub-module. The ground connection conductor may extend over a plurality of sides of the sub-module. The ground connection conductor may extend along two sides of an L shape of the sub-module, for example. The ground connection conductor may extend along two parallel sides on opposite sides of the sub-module, for example. The ground connection conductor may extend along three of the four sides of the sub-module, for example.

As described in some of the embodiments described above, it is preferable that second component 32 be disposed along the surface of the sub-module close to first surface 1a, and second component 32 is mounted on first surface 1a. The use of such a configuration can make the sub-module thinner and make the module lower in profile in its entirety.

Note that, in each of the above-described embodiments, the example where only one sub-module is provided in one module has been described, but a plurality of sub-modules may be provided in one module. At least one sub-module may be mounted on each of first surface 1a and second surface 1b of main substrate 1.

First sealing resin 6a and third sealing resin 6b may be of the same type or different types. First sealing resin 6a and second sealing resin 6c may be of the same type or different types.

Note that each of the above-described embodiments is illustrated with sub-module and main substrate 1 in close contact with each other, but usually, solder or the like is disposed between sub-module and main substrate 1 for establishing electrical connection, so that a slight gap is generated between sub-module and main substrate 1 over a section other than the electrical connection section. Herein, for convenience of description, each embodiment is illustrated with sub-module and main substrate 1 in close contact with each other. In practice, sub-module and main substrate 1 may be in close contact with each other or may have a slight gap therebetween.

Note that a combination of some of the embodiments may be employed as needed.

Note that the embodiments disclosed herein are illustrative in all respects and are not restrictive. The scope of the present disclosure is set forth by the claims, and the present disclosure is intended to include the claims, equivalents of the claims, and all modifications within the scope.

1: main substrate, 1a: first surface, 1b: second surface, 2: insulating layer, 6a: first sealing resin, 6b: third sealing resin, 6c: second sealing resin, 8: outer shield film, 9: inner shield film, 12: carrier tape, 17: external terminal, 18: columnar conductor, 31: first component, 32: second component, 34, 35, 36, 37: component, 45, 45i, 45j, 45k: ground connection conductor, 46, 47, 48: depression, 81, 81i, 81j, 81k: sub-module, 101, 102, 103, 104, 105: module, 145, 145j: member

The invention claimed is:

1. A module comprising:
   a main substrate having a first surface and a second surface, the second surface being on a side opposite from the first surface;
   a sub-module mounted on the first surface;
   a first component mounted on the first surface separately from the sub-module; and
   a first sealing resin disposed so as to cover the first surface and the first component,
   wherein
   the sub-module includes a second component, a second sealing resin disposed so as to cover the second component, and an inner shield film disposed so as to cover at least a part of side surfaces of the second sealing resin and to not be electrically connected to the main substrate,
   a ground connection conductor is disposed so as to be electrically connected to the inner shield film, and
   the ground connection conductor is exposed outside the first sealing resin.

2. The module according to claim 1, wherein the ground connection conductor is in contact with the first surface, and the ground connection conductor is disposed along the inner shield film.

3. The module according to claim 2, wherein the ground connection conductor has a columnar shape, and the ground connection conductor is equal in height to the second sealing resin relative to the first surface.

4. The module according to claim 1, wherein the ground connection conductor is not in contact with the first surface and is disposed more remotely from the first surface than an end of the inner shield film located at a side remote from the first surface.

5. The module according to claim 1, wherein the ground connection conductor has any shape selected from a dot shape, a line shape, and a frame shape, as viewed from a direction perpendicular to the first surface.

6. The module according to claim 1, wherein the second component is disposed along a surface of the sub-module close to the first surface, and the second component is mounted on the first surface.

7. The module according to claim 1, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

8. The module according to claim 2, wherein the ground connection conductor has any shape selected from a dot shape, a line shape, and a frame shape, as viewed from a direction perpendicular to the first surface.

9. The module according to claim 3, wherein the ground connection conductor has any shape selected from a dot shape, a line shape, and a frame shape, as viewed from a direction perpendicular to the first surface.

10. The module according to claim 4, wherein the ground connection conductor has any shape selected from a dot shape, a line shape, and a frame shape, as viewed from a direction perpendicular to the first surface.

11. The module according to claim 2, wherein the second component is disposed along a surface of the sub-module close to the first surface, and the second component is mounted on the first surface.

12. The module according to claim 3, wherein the second component is disposed along a surface of the sub-module close to the first surface, and the second component is mounted on the first surface.

13. The module according to claim 4, wherein the second component is disposed along a surface of the sub-module close to the first surface, and the second component is mounted on the first surface.

14. The module according to claim 5, wherein the second component is disposed along a surface of the sub-module close to the first surface, and the second component is mounted on the first surface.

15. The module according to claim 2, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

16. The module according to claim 3, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

17. The module according to claim 4, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

18. The module according to claim 5, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

19. The module according to claim 6, further comprising:
a third component mounted on the second surface;
a third sealing resin disposed so as to cover the second surface and the third component; and
an outer shield film disposed so as to cover side surfaces of the first sealing resin, side surfaces of the main substrate, and a surface of the third sealing resin remote from the second surface and side surfaces of the third sealing resin.

* * * * *